United States Patent [19]

Hoffman et al.

[11] Patent Number: 4,687,537

[45] Date of Patent: Aug. 18, 1987

[54] EPITAXIAL METAL SILICIDE LAYERS

[75] Inventors: Dorothy M. Hoffman, Hopewell Township, Mercer County; Frederick J. Tams, III, Hamilton Township, Mercer County; Joseph T. McGinn, Raritan Township, Hunterdon County, all of N.J.

[73] Assignee: RCA Corporation, Princeton, N.J.

[21] Appl. No.: 852,290

[22] Filed: Apr. 15, 1986

[51] Int. Cl.$^4$ .............................................. H01L 21/66
[52] U.S. Cl. ..................... 156/612; 156/610; 156/614; 156/DIG. 64; 156/DIG. 75; 156/DIG. 87; 156/DIG. 95; 156/DIG. 101; 156/DIG. 102; 156/DIG. 106; 437/178
[58] Field of Search .............. 156/610, 621, 624, 612, 156/614, DIG. 64, DIG. 75, DIG. 87, DIG. 95, DIG. 101, DIG. 102, DIG. 106; 427/84, 93

[56] References Cited

U.S. PATENT DOCUMENTS

| | | | |
|---|---|---|---|
| 3,757,123 | 9/1973 | Archer et al. | 250/338 |
| 3,841,904 | 10/1974 | Chiang | 117/200 |
| 3,889,359 | 6/1975 | Rand | 29/578 |
| 3,927,225 | 12/1975 | Cordes et al. | 427/84 |
| 3,968,019 | 7/1976 | Hanazono et al. | 204/192 |
| 3,968,272 | 7/1976 | Anand | 427/84 |
| 4,056,642 | 11/1977 | Saxena et al. | 427/84 |
| 4,110,488 | 8/1978 | Risko | 427/84 |
| 4,206,540 | 6/1980 | Gould | 156/638 |
| 4,398,344 | 8/1983 | Gould | 427/84 |
| 4,619,035 | 10/1986 | Holta et al. | 427/84 |

FOREIGN PATENT DOCUMENTS 3018973  8/1976  Japan ..................... 427/84

OTHER PUBLICATIONS

Kosonocky et al. in SPIE, vol. 225, IR Image Sensor Tech., pp. 69-71 (1980).
Kosonocky et al. 1978 International Conf. on Applications of Charge-Coupled Devices, Oct., 1978, 12 pages.

*Primary Examiner*—Asok Pal
*Attorney, Agent, or Firm*—Joseph S. Tripoli; James M. Trygg; R. Hain Swope

[57] ABSTRACT

A process of forming an epitaxial metal silicide layer on a silicon substrate is disclosed. A thin layer of a first metal that will form an oxide in preference to silicon is initially deposited on the substrate. A preferred first metal is titanium. A layer of palladium, platinum or iridium is deposited thereover. An exceptionally uniform, conductive layer of metal silicide is thereby formed by epitaxial growth without the necessity of a high temperature anneal. The disclosed process is particularly useful in forming ultra thin metal silicide Schottky barriers in devices such as infrared imaging arrays.

6 Claims, 3 Drawing Figures

EPITAXIAL METAL SILICIDE LAYERS

This invention relates to the formation of epitaxial metal silicide layers on a semiconductor substrate. More particularly, this invention relates to the formation of ultra thin epitaxial metal silicide layers which are useful, for example, as Schottky barriers in infrared imaging arrays.

BACKGROUND OF THE INVENTION

In the fabrication of certain semiconductor devices, such as monolithic infrared image sensors, it is desirable to provide ultra thin metal silicide layers on semiconductor substrates, particularly high resistivity silicon substrates. In order to obtain maximum sensitivity, it is further desirable that such layers be as thin as possible, preferably less than 10 nanometers in thickness and, ideally, 1 nanometer or less.

Ultra thin metal silicide layers are particularly useful as Schottky barriers in infrared imaging arrays, generally referred to as IR-CCD's. Such devices usually include infrared detectors that generate charge in response to thermal radiation and also include readout registers in the form of charge coupled devices that scan the detectors and output video signals. These devices are formed on high resistivity, P type silicon substrates having high sheet resistance uniformity. The infrared detectors are Schottky barrier photodiodes comprising layers of metal silicides, such as platinum silicide or palladium silicide formed on the orientation, i.e. 100 or 111, of the substrate. In operation, these detectors respond to infrared radiation emitted by objects to be viewed and this radiation causes the photoexcitation of hole-electron pairs in the silicide layer followed by the internal photoemission of holes over the contact barrier. It is the electrons left on the silicide electrode layer that are read out by the charge coupled devices.

It is well established, for example see ADVANCES IN PLATINUM SILICIDE SCHOTTKY-BARRIER IR-CCD IMAGE SENSORS by Kosonocky et al. in SPIE, Vol. 225, pages 69-71 (1980), that the sensitivity to infrared radiation of metal silicide layers in Schottky barrier detectors increases as their thickness decreases. It is reported therein that a Schottky barrier layer formed from a 10 nm thick layer of deposited platinum has about five times the sensitivity of a similar layer formed from a 60 nm thick layer of deposited platinum. Until now, the problem has been how to form such ultra thin layers uniformly and reproducibly. The results of efforts to date to produce ultra thin metal silicide layers have been inconsistent in that the layers were not uniform in thickness and/or did not completely cover the substrate. The incidence of such nonuniformities has been shown to be related to the metal being used; e.g., there is a greater incidence of nonuniformities using palladium than platinum. In order to obtain complete coverage of the substrate, it has been necessary heretofore to increase the thickness of the metal layer. While this may resolve the problem of incomplete coverage, it usually aggravates the nonuniformity problem. A means of providing an ultra thin metal silicide layer which has neither of these disadvantages has been found in accordance with this invention.

SUMMARY OF THE INVENTION

A process of forming layers, particularly ultra thin layers, of epitaxially grown metal silicide on a silicon substrate is provided. A sublayer of a metal such as titanium is initially formed on the substrate and a desired second metal is deposited thereover. The second metal silicide crystals grow epitaxially on the silicon substrate.

DETAILED DESCRIPTION OF THE INVENTION

Figure 1:
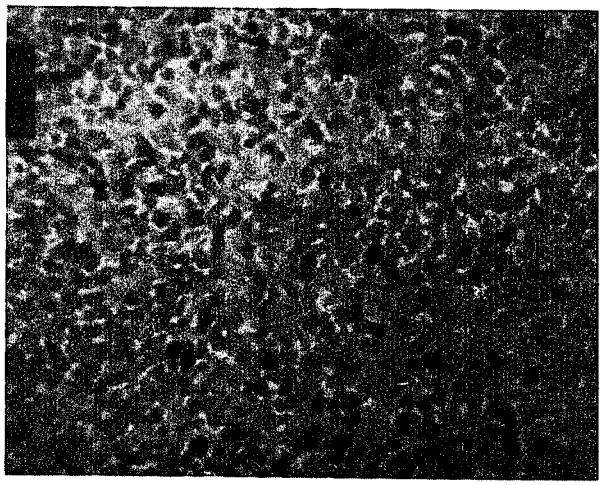
FIG. 1 is an electronmicrograph of a layer of palladium silicide deposited on the surface of a type (100) silicon wafer.

The substrate upon which a layer of metal silicide is formed in accordance with this invention is a silicon wafer or another substrate having silicon on the surface. When the metal silicide layer is intended to be used as a Schottky barrier photodiode in an IR-CCD, the substrate is a type 100 or 111 monocrystalline silicon wafer which has been appropriately doped with, for example, boron atoms, to have a very uniform resistivity of from about 10 to 50 ohm-cm.

The surface of the silicon substrate must be cleaned in preparation for the deposition of the subject metal silicide layers. The cleaning is primarily intended to remove native oxide from the surface of the silicon wafer. Conventionally, the wafer is immersed in an etchant, such as buffered hydrofluoric acid, and thereafter placed in an inert ambient, such as nitrogen, to exclude air and oxygen from the surface. It is recognized by those skilled in the art, however, that even cleaning the silicon substrate in a vacuum chamber, a procedure considered not well suited to large scale manufacture, will not totally prevent the formation of some native oxide on the surface of the silicon substrate. The oxide will be present as minute areas or dots which are, in effect, the initial stage of the growth of a layer of oxide. Even these discrete areas of oxide have an adverse effect on the conventional deposition of a layer of metal thereon.

In accordance with this invention, following conventional cleaning of the silicon substrate, there is deposited thereon a sublayer of a first metal which will form an oxide in preference to silicon. A suitable metal is selected from the group consisting of titanium, chromium, vanadium, zirconium, tantalum and hafnium, with titanium being preferred. The sublayer is suitably deposited to a density of from about $6 \times 10^{14}$ to $6 \times 10^{15}$ metal atoms per square centimeter, which is equivalent to a layer from about 0.1 to 1 nanometer in thickness. A preferred sublayer is a molecular layer of titanium which contains about $1.8 \times 10^{15}$ atoms/cm$^2$, which is equivalent to a thickness of about 0.3 nanometer. Due to the preference of the first metal to form an oxide, the sublayer acts to scavenge the native oxide from the substrate surface, thus cleaning the surface and producing a more uniform distribution of the over-deposited second metal. The sublayer of metal is deposited on the substrate surface by conventional means, suitably by electron beam evaporation in a conventional vacuum evaporation chamber. Deposition is suitably carried out at a pressure of from about $1 \times 10^{-6}$ to $1 \times 10^{-7}$ mtorr and a temperature of from about 200° to 350° C. The subject process is advantageous in that it is a low temperature process, yet produces a more uniform, more highly oriented metal silicide layer at least comparable to metal silicide layers which, heretofore, have been formed only by annealing at high temperatures, i.e. 600°–700° C. Since, in contrast to known processes, the subject metal silicides grow epitaxially, a high temperature anneal is not required.

Because the quantity of metal in the sublayer is so small, the layer is predominantly in the form of the metal oxide by virtue of the capacity of the metal to form an oxide in preference to silicon. The metal will also form an oxide with trace amounts of oxygen which may be present in the deposition chamber. The sublayer should have a density of at least about $6 \times 10^{14}$ metal atoms/cm$^2$ to assure that there is sufficient metal to effectively remove the small quantity of native oxide on the substrate surface. Conversely, the sublayer should not be substantially more than about $6 \times 10^{15}$ atoms/cm$^2$ in order not to hinder the epitaxial growth of the desired metal silicide. By cleaning the small amounts of oxide that are inevitably present on the substrate surface, the metal sublayer substantially reduces agglomeration of the overdeposited second metal layer.

The metal sublayer of this invention is further advantageous in that it promotes the epitaxial growth of a layer of metal silicide when a second metal, such as palladium, platinum or iridium, is deposited thereover. The exact mechanism whereby this takes place is not understood with certainty. The fact that the grains of the resulting metal silicide layer are heteroepitaxially related to the substrate as opposed to randomly oriented is advantageous in that it is a significantly more uniform, regular structure and, therefore, is more conductive than conventionally formed polycrystalline structures. Another advantage of the subject process is that the interface between the metal silicide layer and the substrate is exceptionally clean and has a very low resistance. Therefore, the subject process can be utilized to form thicker layers of metal, e.g. 100 nm, which, because of the quality of the interface, are useful as metal contacts.

The metal silicide layer is formed by depositing the desired second metal, suitably by conventional electron beam evaporation, over the sublayer. Advantageously, the two layers are deposited sequentially in the same apparatus under similar conditions. Sufficient metal is deposited so that the resulting layer of epitaxial metal silicide is from about one to ten, preferably from about 1.5 to 4.5, nanometers thick for thin films useful, for example, in Schottky devices. It will be appreciated that thicker layers would be deposited for other applications, such as metal contacts.

The metal utilized to form the silicide layer is selected from the group consisting of palladium, platinum and iridium. The deposition temperature utilized will depend on the metal; i.e. palladium will suitably be deposited at about 200° to 325° C. whereas higher temperatures, i.e. from about 550° to 650° C., are utilized for the deposition of iridium. When the desired thickness of metal silicide has been formed, heating is discontinued and the substrate is permitted to return to ambient temperature. This is advantageous over conventional procedures, most of which require that heating be continued for up to about thirty minutes after metal deposition has ceased. The subject process is further advantageous in that there is less likelihood of damage to other structures on the substrate than prior processes because a high temperature anneal of the metal layer is not necessary. These advantages are significant with regard to savings of time and energy as well as with regard to the quality of the metal silicide. A further processing advantage of the subject invention is that, since the metal silicide layer forms as such, there is no need to etch away excess metal which may not have been converted to the silicide by annealing as is commonly done in prior art processes.

Figure 2:
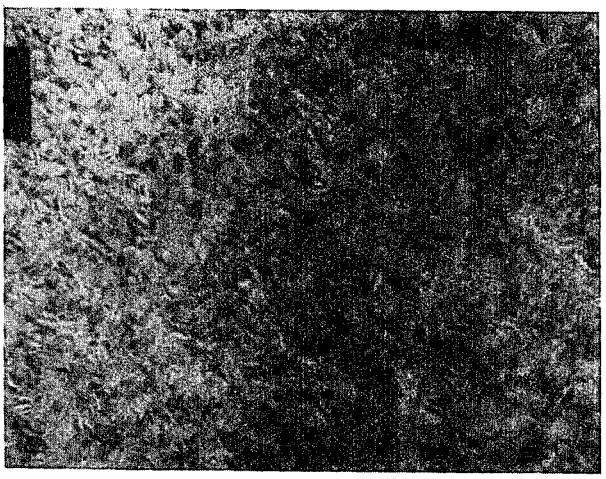
FIG. 2 is an electronmicrograph of a layer of epitaxially grown palladium silicide formed on a similar wafer in accordance with this invention.

The particular metal silicide layer formed in accordance with this invention will depend on its intended application. Detectors incorporating a Schottky barrier of palladium silicide are particularly sensitive to light in the near IR range. Those incorporating a layer of iridium silicide are sensitive to light in the far IR range and those with a platinum silicide layer are sensitive to light in between. It has been found that the most striking improvement in a metal silicide layer in accordance with this invention is produced by growing epitaxial palladium silicide over a sublayer of titanium. This remarkable improvement can readily be seen by comparing the photographs of FIGS. 1 and 2. The palladium silicide layer in each instance was deposited onto a type (100) silicon wafer. The wafer surface had been conventionally prepared by immersion in buffered hydrofluoric acid and immediate insertion into a nitrogen atmosphere. The irregular nature and agglomeration of the palladium silicide layer, which has been deposited at 250° C., is clearly seen in FIG. 1. The uniformity of the epitaxial layer produced in accordance with this invention, which did not require a high temperature anneal, is evident from FIG. 2. The wafer in FIG. 2 was sequentially coated with $1.8 \times 10^{15}$ titanium atoms/cm$^2$ and the equivalent of 3 nm of palladium which, upon contact with the surface, forms the silicide by epitaxial growth. The exceptional uniformity and reduced agglomeration density in the epitaxial palladium silicide layer of FIG. 2 is in sharp contrast to that of FIG. 1. This exceptional uniformity is of particular advantage when incorporating metal silicide thin films into a Schottky barrier detector.

Figure 3:
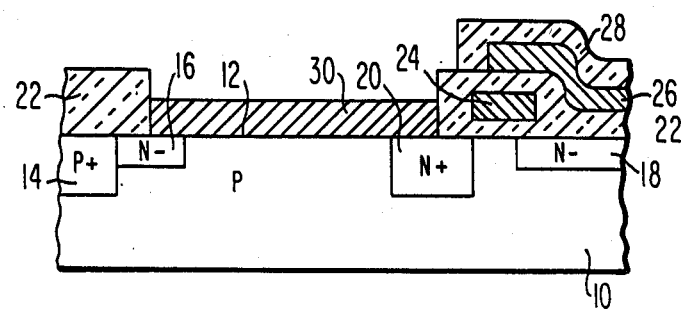
FIG. 3 is a section view illustrating a portion of a wafer containing a Schottky barrier metal silicide layer.

A typical palladium silicide Schottky barrier photodiode which can be utilized in an IR-CCD is shown in partial cross section in FIG. 3. In FIG. 3, a wafer 10 having a major surface 12 is doped with P type atoms, such as boron, so as to have a very uniform resistivity of from about 10 to 50 ohm-cm. Formed adjacent to the major surface 12 are: N+ source and drain regions, not shown; P+ channel stop diffusions 14 that isolate the detectors from each other; N− guardrings 16 that surround the channel stops and help to reduce excess leakage current at the edge of the detector; an N-channel region 18 that forms the buried channel CCD portion that reads the charge from the detectors; and an N+ region 20 that contacts the silicide electrode and facilitates the transfer of charge from the infrared detectors to the CCD device.

Partially covering the surface 12 is an oxide layer 22 in which is formed a first level polycrystalline silicon gate 24 that is arranged to be connected to a voltage source to control the transfer of charge from the N+ region 20, and thus the infrared detector, to the CCD region under the N− channel 18. A second level polycrystalline silicon gate 26, which overlies the oxide layer 22, is arranged to be connected to a voltage source to control the transfer of charge along the CCD buried channel. An additional layer of oxide 28 overlies the second gate 26. The metal silicide layer 30 is formed on surface 12 through a contact opening in the oxide layer 22. It will be appreciated that there are a plurality of surface regions 12 on a wafer and that the silicide layer 30 is formed on each simultaneously.

Devices made in accordance with this invention demonstrate improved conductivity over previous devices. This is due to the uniformity of the heteroepitaxial silicide layer itself and the interface thereof with the silicon wafer. The sublayer does not detract from the quality of the interface and would appear to diffuse through the silicide layer. It is difficult to determine the extent to which this takes place due to the small quantity of sublayer which is present. It has been determined, however, that the sublayer does not remain as an entity under the silicide layer.

The process of this invention is useful in making a variety of other devices wherein a metal silicide layer is to be formed in a semiconductor substrate. In particular, the subject process is useful for those applications wherein an epitaxial metal silicide layer is desired.

The invention has been described with reference to preferred embodiments thereof. It will be appreciated by those skilled in the art that various modifications may be made from the specific details given without departing from the spirit and scope of the invention.

We claim:

1. A process of forming a layer of a metal silicide on the surface of a silicon substrate comprising depositing at a temperature of from about 200° to 325° C. a first metal which will form an oxide in preference to silicon, said metal being selected from the group consisting of titanium, vanadium, zirconium, tantalum, chromium and hafnium, and depositing thereover a layer of a second metal selected from the group consisting of palladium and platinum whereby the silicide of the second metal is formed by epitaxial growth.

2. A process in accordance with claim 1, wherein the first metal is titanium.

3. A process in accordance with claim 2, wherein the second metal is palladium.

4. A process in accordance with claim 1, wherein the first metal is deposited to a density of from about $6 \times 10^{14}$ to about $6 \times 10^{15}$ atoms per square centimeter.

5. A process in accordance with claim 4, wherein the first metal is deposited to a density of about $1.8 \times 10^{15}$ atoms per square centimeter.

6. A process in accordance with claim 1, wherein the layer of epitaxial metal silicide is from about one to about ten nanometers thick.

* * * * *